US011489527B2

(12) United States Patent
Weber et al.

(10) Patent No.: US 11,489,527 B2
(45) Date of Patent: Nov. 1, 2022

(54) THREE DIMENSIONAL PROGRAMMABLE LOGIC CIRCUIT SYSTEMS AND METHODS

(71) Applicant: Intel Corporation, Santa Clara, CA (US)

(72) Inventors: Scott Weber, Piedmont, CA (US); Aravind Dasu, Milpitas, CA (US); Ravi Gutala, San Jose, CA (US); Mahesh Iyer, Fremont, CA (US); Eriko Nurvitadhi, Beaverton, OR (US); Archanna Srinivasan, San Jose, CA (US); Sean Atsatt, Santa Cruz, CA (US); James Ball, Scotts Valley, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/354,473

(22) Filed: Jun. 22, 2021

(65) Prior Publication Data

US 2021/0313988 A1    Oct. 7, 2021

(51) Int. Cl.
*H03K 19/17736* (2020.01)
*H01L 25/18* (2006.01)
*H03K 19/17768* (2020.01)
*H03K 19/1776* (2020.01)

(52) U.S. Cl.
CPC ......... *H03K 19/1774* (2013.01); *H01L 25/18* (2013.01); *H03K 19/1776* (2013.01); *H03K 19/17768* (2013.01)

(58) Field of Classification Search
None
See application file for complete search history.

(56) References Cited

U.S. PATENT DOCUMENTS

| 9,588,176 | B1 | 3/2017 | Hutton et al. |
| 10,291,397 | B2 | 5/2019 | McElheny et al. |
| 10,666,265 | B2 | 5/2020 | Clark et al. |
| 10,833,679 | B2 | 11/2020 | Clark et al. |
| 2018/0143777 | A1 | 5/2018 | Dasu et al. |
| 2018/0143860 | A1 | 5/2018 | Dasu et al. |
| 2019/0012116 | A1 | 1/2019 | Gutala et al. |
| 2019/0041923 | A1 | 2/2019 | Atsatt et al. |

(Continued)

*Primary Examiner* — Jany Richardson
(74) *Attorney, Agent, or Firm* — InventIQ Legal LLP; Steven J. Cahill

(57) ABSTRACT

A three dimensional circuit system includes first and second integrated circuit (IC) dies. The first IC die includes programmable logic circuits arranged in sectors and first programmable interconnection circuits having first router circuits. The second IC die includes non-programmable circuits arranged in regions and second programmable interconnection circuits having second router circuits. Each of the regions in the second IC die is vertically aligned with at least one of the sectors in the first IC die. Each of the second router circuits is coupled to one of the first router circuits through a vertical die-to-die connection. The first and second programmable interconnection circuits are programmable to route signals between the programmable logic circuits and the non-programmable circuits through the first and second router circuits. The circuit system may include additional IC dies. The first and second IC dies and any additional IC dies are coupled in a vertically stacked configuration.

21 Claims, 4 Drawing Sheets

(56) References Cited

U.S. PATENT DOCUMENTS

| | | |
|---|---|---|
| 2019/0042127 A1 | 2/2019 | Weber et al. |
| 2019/0043536 A1 | 2/2019 | Weber et al. |
| 2019/0044515 A1* | 2/2019 | Gutala ............. H03K 19/17796 |
| 2019/0044519 A1 | 2/2019 | Atsatt et al. |
| 2020/0119736 A1 | 4/2020 | Weber et al. |

* cited by examiner

THREE DIMENSIONAL PROGRAMMABLE LOGIC CIRCUIT SYSTEMS AND METHODS

FIELD OF THE DISCLOSURE

The present disclosure relates to electronic integrated circuit systems and methods, and more particularly, to three dimensional programmable logic circuit systems and methods.

BACKGROUND

Programmable logic integrated circuits, such as field programmable gate arrays (FPGAs) are used for a diverse range of application acceleration tasks in edge systems and datacenters. Programmable logic integrated circuits typically contain a collection of individually configurable circuits. Programmable logic integrated circuits may be reconfigured during operation in a datacenter to perform different acceleration tasks for host processors.

DETAILED DESCRIPTION

As stated above, programmable logic integrated circuits may be reconfigured during datacenter operation to perform different acceleration tasks for host processors. However, the speed of reconfiguration of programmable logic integrated circuits is traditionally several orders of magnitude slower than the desired rate of virtualization in datacenters. Moreover, on-chip caching or buffering of pre-fetched configuration bit streams to hide the latency of reconfiguration is undesirably expensive in terms of silicon real estate. Additionally, repeated fetching of configuration bit streams from off-chip storage via the entire configuration circuit chain is energy intensive. Therefore, there is a need to reduce the time it takes to reconfigure programmable logic integrated circuits.

According to some embodiments disclosed herein, the components of a programmable logic integrated circuit (IC) that are typically in a single integrated circuit die are separated into two vertically stacked integrated circuit dies. As an example, the programmable circuitry typically located in the core logic region of a programmable logic IC may be placed in a first IC die, and the non-programmable circuitry may be placed in a second IC die. The first integrated circuit die may include, for example, programmable logic circuit blocks, programmable memory circuits, and programmable digital signal processing (DSP) circuits. The first integrated circuit die may also include interface circuits and programmable interconnections circuits. The second integrated circuit die may include input/output driver circuits, processor circuits, global and local control circuits, clock signal generation circuits, transceiver circuits, interface circuits, and additional programmable logic circuits. The circuitry in the first and second IC dies may communicate with each other, for example, through interconnection and interface circuits in each IC die and through die-to-die connections between the IC dies. Because the first integrated circuit die does not have the non-programmable circuitry that is in the second IC die, the first integrated circuit die may have a higher yield, may be easier to repair, and may have an improved power, performance, and area usage compared to a typical programmable logic IC.

Figure 1:
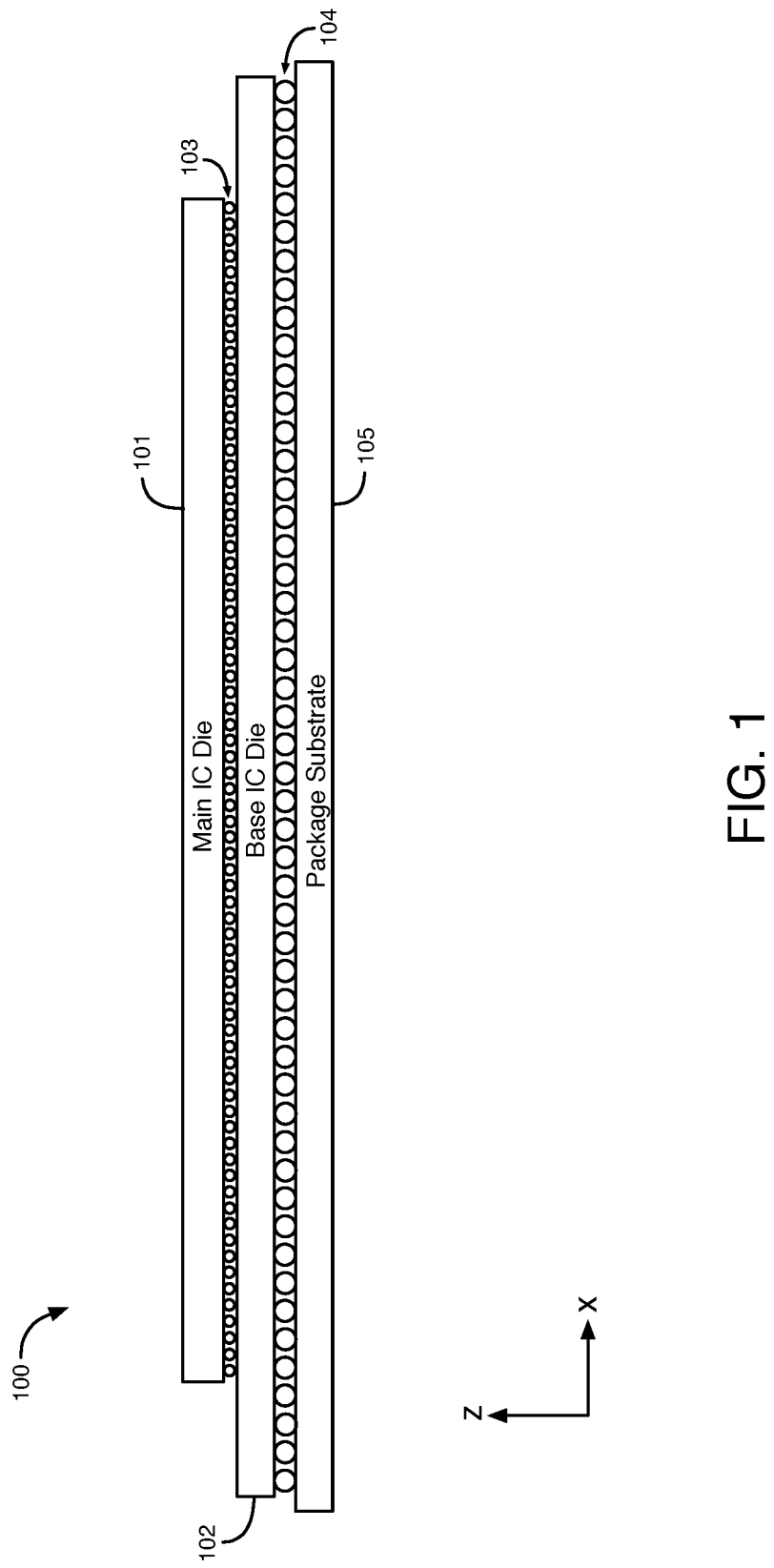
FIG. 1 illustrates a cross section of an exemplary integrated circuit package that includes a main integrated circuit (IC) die, a base IC die, and a package substrate, according to an embodiment.

Figure (FIG.) 1 illustrates a cross section of an exemplary integrated circuit (IC) package 100 that includes a main integrated circuit (IC) die 101, a base IC die 102, and a package substrate 105, according to an embodiment. The main IC die 101 and the base IC die 102 are vertically stacked and coupled together in the z direction shown in FIG. 1 to create a three dimensional (3D) programmable logic circuit system. The main IC die 101 is coupled to the base IC 102 through several conductive connections 103. Conductive connections 103 may be, for example, microbumps, hybrid-bonding connections, magnetic coupling connections, or thermo-compression bonding connections. The base IC die 102 is longer than the main IC die 101 in the x direction, as shown in FIG. 1, such that the base IC die 102 extends beyond each of the edges of the main IC die 101. The base IC die 102 is coupled to the package substrate 105 through several conductive connections 104 (e.g., bumps).

In the embodiment of FIG. 1, IC dies 101 and 102 may include circuitry that is typically located in a single IC die in a previously known FPGA. Main IC die 101 includes programmable logic circuitry and interconnections that are typically located in a core logic region of a programmable logic IC, such as programmable logic circuit blocks, programmable memory circuits, programmable digital signal processing (DSP) circuits, interface circuits, and programmable interconnection circuits. Base IC die 102 includes non-programmable circuitry, such as input/output driver circuits, processor circuits, global and local control circuits, clock signal generation circuits, transceiver circuits, memory circuits, and interface circuits. The base IC die 102 may also include some programmable logic circuits. In some embodiments, the base IC die 102 may contain several memory circuits. The circuitry in the main IC die 101 communicates with the circuitry in the base IC die 102 through conductive connections 103, and conductive pads (not shown) on each of IC dies 101-102. The circuitry in the main IC die 101 may also communicate with the circuitry in the base IC die 102 using through-silicon-vias in each die.

Because most or all of the programmable logic circuits in IC package 100 are in a separate IC die 101 than most or all of the non-programmable circuits in IC package 100, the main IC die 101 may be fabricated using the most advanced available semiconductor processing node technology, while the base IC die 102 may be fabricated using an older semiconductor processing node technology. By fabricating the main IC die 101 with only (or mainly) programmable logic and memory circuits, the yield of IC die 101 may be significantly increased, and IC die 101 may be more repairable, because IC die 101 is less heterogenous than programmable IC dies that have a substantial amount of non-programmable analog circuitry. Also, fabricating main IC die 101 with the most advanced available semiconductor processing node technology allows the power, performance, and area of IC die 101 to be optimized. In some embodiments, the base IC die 102 may be built in a different semiconductor process node than the main IC die 101 for cost or electrical advantages. As an example, some high voltage analog input-output (IO) circuits (e.g., 3V volt 10 circuits) are difficult to build in a lower voltage leading process node. The base IC die 102 may, for example, be fabricated using a less advanced process node than the main IC die 101, so that the base IC die 102 has improved manufacturing yields compared to the main IC die 101.

Figure 2:
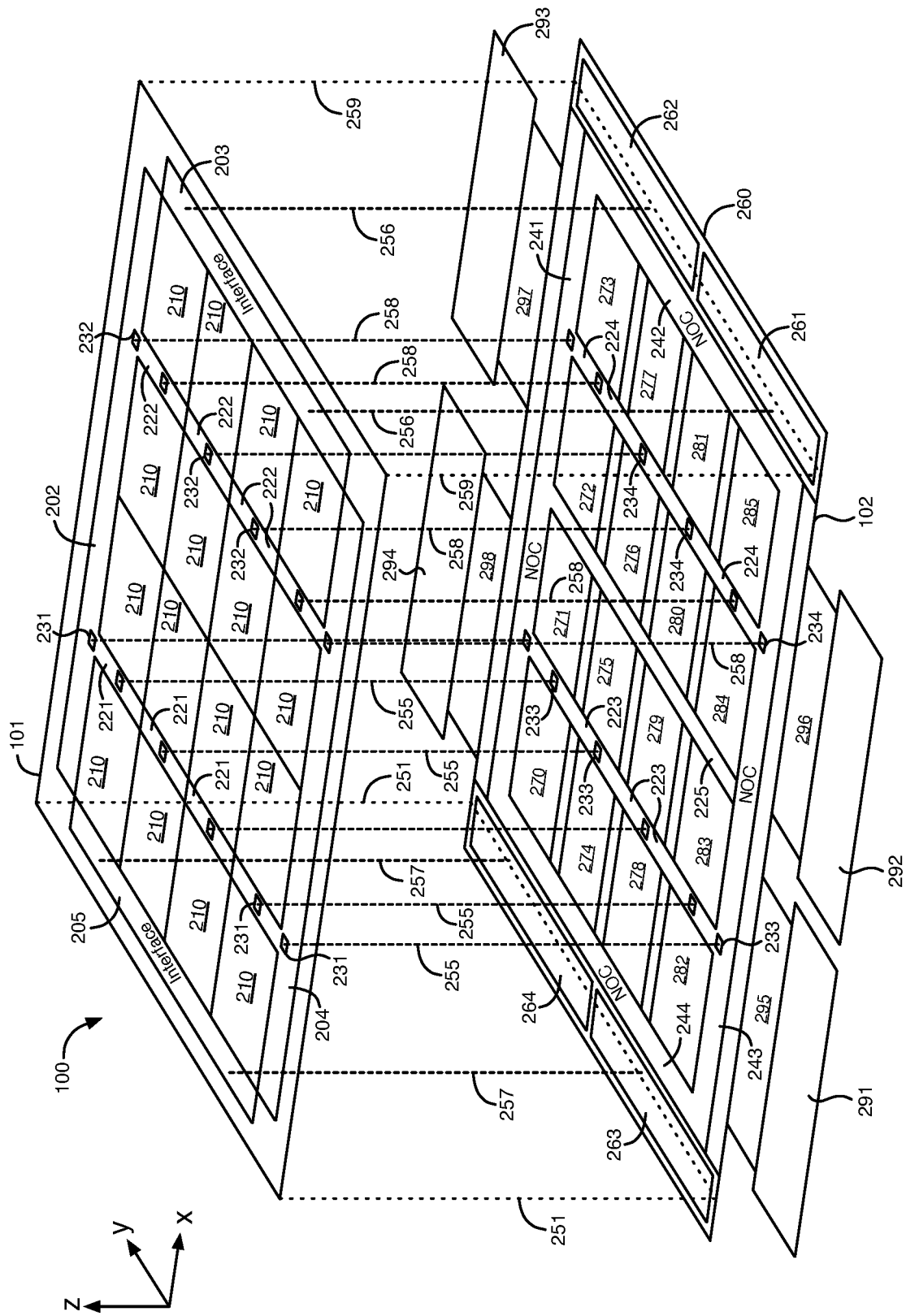
FIG. 2 illustrates additional details of the main integrated circuit (IC) die and the base IC die in the IC package of FIG. 1, according to an embodiment.

FIG. 2 illustrates additional details of the main IC die 101 and the base IC die 102 in IC package 100 of FIG. 1, according to an embodiment. In the embodiment of FIG. 2, IC package 100 also includes additional memory integrated circuit (IC) dies 291-294 that are coupled to base IC die 102 through connections 295-298, respectively, in package substrate 105. Memory IC dies 291-294 may include, for example, dynamic random access memory (DRAM) circuits, static random access memory circuits (SRAM), non-volatile memory circuits such as flash memory, double data rate (DDR) memory, etc.

FIG. 2 shows additional details of each of the IC dies 101-102 in they direction. In the embodiment of FIG. 2, main IC die 101 includes regions 203 and 205 of interface circuits, 16 sectors 210 of programmable logic circuits, and regions of 202, 204, and 221-222 of programmable interconnection circuits. Sectors 210 are arranged in 4 rows and 4 columns along the x and y directions in FIG. 2. Sectors 210 include programmable logic resources, such as programmable logic circuits, programmable memory circuits, programmable digital signal processing (DSP) circuits, and local and global programmable interconnection circuits. The programmable logic circuits may include, for example, combinatorial circuits such as lookup-tables (LUTs) and sequential circuits such as flip-flops. The programmable logic circuits may also include adaptive logic modules that include combinatorial circuits, sequential circuits, and arithmetic circuits. The DSP circuits may perform arithmetic logic functions (such as addition, subtraction, and multiplication) and signal processing algorithms.

Each of the regions 202, 204, and 221-222 of programmable interconnection circuits may include a network-on-chip (NOC) that includes conductive wires or buses and programmable router circuits. For example, region 221 may include a network-on-chip that includes conductive wires or buses and 5 router circuits 231 that are programmable to couple together selected ones of the conductive wires or buses in region 221. Region 222 may include a NOC that includes conductive wires or buses and 5 router circuits 232 that are programmable to couple together selected ones of the conductive wires or buses in region 222. The NOCs in regions 202, 204, and 221-222 may be programmed to couple together selected circuits in any of the sectors 210.

In some embodiments, regions 202 and 204 may also, or alternatively, include die-to-die interface circuits that transmit signals to and receive signals from base IC die 102. The regions 203 and 205 of main IC die 101 may also include die-to-die interface circuits that transmit signals to and receive signals from base IC die 102. The die-to-die interface circuits in regions 202-205 may include transmitter and receiver circuits (e.g., transceivers) that transfer data, clock, and control signals between sectors 210 in the main IC die 101 and circuits in base IC die 102. Base IC die 102 includes transceiver circuits 261-262 that are coupled to the die-to-die interface circuits in region 203 through vertical die-to-die connections 256 (e.g., a subset of connections 103). Base IC die 102 also includes transceiver circuits 263-264 that are coupled to the die-to-die interface circuits in region 205 through vertical die-to-die connections 257 (e.g., a subset of connections 103).

Transceiver circuits 261-262 may transmit signals to and receive signals from the die-to-die interface circuits in region 203 through vertical die-to-die connections 256. Transceiver circuits 263-264 may transmit signals to and receive signals from the die-to-die interface circuits in region 205 through vertical die-to-die connections 257. Transceiver circuits 261-262 and the die-to-die interface circuits in region 203 may exchange data, clock, and control signals between the sectors 210 adjacent to region 203 and circuitry in base IC die 102. Transceiver circuits 263-264 and the die-to-die interface circuits in region 205 may exchange data, clock, and control signals between the sectors 210 adjacent to region 205 and circuitry in base IC die 102. Transceiver circuits 261-262 extend beyond an edge of main IC 101, as shown by the dotted lines 259 in the z direction and the dotted line across transceivers 261-262 in the y direction in FIG. 2. Transceiver circuits 263-264 extend beyond an edge of main IC 101, as shown by the dotted lines 251 in the z direction and the dotted line across transceivers 263-264 in the y direction in FIG. 2.

The base IC die 102 also includes 16 regions 270-285 of circuitry. The 16 regions 270-285 are arranged in 4 rows and 4 columns along the x and y directions in FIG. 2. In some embodiments, the 16 regions 270-285 may be situated directly below corresponding ones of the sectors 210 in main IC die 101 in the z direction. The regions 270-285 may include non-programmable circuitry, such as input/output driver circuits, processor circuits, global and local control circuits, and/or clock signal generation circuits. A non-programmable circuit may occupy one or more of the regions 270-285. As an example, 2, 3 or 4 of the regions 270-285 may include a processor circuit. As another example, regions 270-271 may include input/output driver and/or transceiver circuits that transmit signals to and receive signals from memory IC die 294 through connections 298. As another example, regions 272-273 may include input/output driver and/or transceiver circuits that transmit signals to and receive signals from memory IC die 293 through connections 297. As yet another example, regions 282-283 may include input/output driver and/or transceiver circuits that transmit signals to and receive signals from memory IC die 291 through connections 295. As yet another example, regions 284-285 may include input/output driver and/or transceiver circuits that transmit signals to and receive signals from memory IC die 292 through connections 296. As another example, any one or more of the regions 270-285 in the base IC die 102 can include input/output (IO) circuits that connect directly to external devices through the package substrate 105 and connections 104. These IO circuits may help to alleviate the IO scaling limitations of traditional field programmable gate arrays (FPGAs), without interfering with the uniformity of the programmable logic fabric in the main IC die 101.

As another example, any one or more of the regions 270-285 may include a hard intellectual property (HIP) circuit block, such as a processor circuit. As a more specific example, any one or more of regions 270-285 may include a hard processor system (HPS). The hard processor system may include a processor circuit, an interface between the processor circuit and other circuitry in IC die 102, memory circuits, a direct memory access controller circuit, a security manager circuit, controller circuits, timer circuits, debugging components, and other circuitry and software.

As another more specific example, any of regions 270-285 may include a HIP circuit block that performs security functions (e.g., using a microprocessor), such as tamper detection functions, voltage monitoring functions, encryption, decryption, and authentication of data streams. The security HIP circuit may control and coordinate some or all of the data transfers between base IC die 102 and IC dies 101 and 291-294.

As yet another example, any one or more of the regions 270-285 may include one or more global control circuits and/or one or more local control circuits. Each of the global and local control circuits may include one or more microprocessors. In some embodiments, one of the regions 270-285 includes a global control circuit and one or more of the regions 270-285 includes 16 local control circuits. The global control circuit coordinates the operations of the local control circuits, controls communication between the local control circuits and the transceivers 261-264, and controls security features of the programmable logic system of FIG. 2. Each of the 16 local control circuits may control the programmable logic circuits in one of the sectors 210 in IC die 101.

The global and local control circuits in IC die 102 may provide many functions in the programmable logic system. As an example, the global control circuit may provide security functions for the programmable logic system including encryption/decryption functions and tamper detection functions. As another example, configuration data for configuring the functions of the programmable logic circuits in sectors 210 may be initially provided to the global control circuit. The global control circuit may authenticate and encrypt or decrypt the configuration data, and then provide the authenticated and encrypted/decrypted configuration data to the local control circuits. Each local control circuit receives configuration data for the sector 210 that it controls. The local control circuits may parse the configuration data received from the global control circuit and then configure the programmable logic circuits in their respective sectors 210 with the parsed configuration data. After configuration, the local control circuits may monitor for single event upsets (SEUs) in the sectors 210, process scripted responses to these SEUs, and perform hashing or integrity checks for configuration integrity.

As yet another example, any one or more of the regions 270-285 may include one or more clock signal generation circuits, such as one or more phase-locked loop circuits, one or more delay-locked loop circuits, and/or one or more oscillator circuits. The clock signal generation circuits in regions 270-285 may generate one or more clock signals for clocking sequential logic circuits, for example, in sectors 210, in transceivers 261-264, in processor circuits in IC die 102, in the global and local control circuits in IC die 102, and/or in the input/output circuits in IC die 102. As yet another example, one or more of the regions 270-285 may include programmable logic circuits, programmable memory circuits, and/or programmable digital signal processing (DSP) circuits.

Base IC die 102 also includes programmable interconnection circuits, such as a network-on-chip (NOC), in each of the 4 boundary regions 241-244 around the periphery of the regions 270-285, and in each of the 3 linear regions 223-225 that are between the 4 columns of the regions 270-285. Each of the NOCs in regions 241-244 and 223-225 may include conductive wires or buses and router circuits that are programmable to selectively couple together the conductive wires or busses. The programmable interconnection circuits, including the NOCs, in regions 241-244 and 223-225 may be programmable to couple together circuits in any of the regions 270-285 in IC die 102. Signals may be transmitted between circuits in any of the regions 270-285 through the programmable interconnection circuits, including the NOCs, in regions 241-244 and 223-225. Region 241 may also include an interface bus system that includes logic circuits that exchange signals with memory IC dies 293-294 through connections 297-298, respectively. Region 243 may also include an interface bus system that includes logic circuits that exchange signals with memory IC dies 291-292 through connections 295-296, respectively.

The NOC in region 223 in base IC die 102 includes 5 router circuits 233. The router circuits 233 are situated directly below the router circuits 231 in the NOC in region 221 in IC die 101. Each of the router circuits 233 is coupled to one of the router circuits 231 through a vertical die-to-die connection 255. Vertical die-to-die connections 255 (e.g., external connections and through-silicon vias) are shown as dotted lines in FIG. 2. Router circuits 233 can transmit signals to and receive signals from router circuits 231 through vertical connections 255. Router circuits 231 can transmit signals to and receive signals from router circuits 233 through vertical connections 255.

The NOC in region 224 in base IC die 102 includes 5 router circuits 234. The router circuits 234 are situated directly below the router circuits 232 in the NOC in region 222 in IC die 101. Each of the router circuits 234 is coupled to one of the router circuits 232 through a vertical die-to-die connection 258. The vertical die-to-die connections 258 (e.g., external connections and through-silicon vias) are shown as dotted lines in FIG. 2. Router circuits 234 can transmit signals to and receive signals from router circuits 232 through vertical connections 258. Router circuits 232 can transmit signals to and receive signals from router circuits 234 through vertical connections 258.

Signals (such as data, clock, and control signals) can be transmitted between the circuits in regions 270-285 of base IC die 102 and the circuits in sectors 210 of main IC die 101 through the NOCs in regions 241-244 and 223-225 including router circuits 233-234, through vertical die-to-die connections 255 and 258, and through the NOCs in regions 202, 204, and 221-222 including the router circuits 231-232. The router circuits 231-234 and the vertical die-to-die connections 255 and 258 provide direct, high-speed communications between the circuits in sectors 210 and the circuits in regions 270-285.

Signals (such as data, clock, and control signals) can also be transmitted between the circuits in regions 270-285 of base IC die 102 and the circuits in sectors 210 of main IC die 101 through the NOCs in regions 241-244 and 223-225, through transceiver circuits 261-264, through vertical die-to-die connections 256-257, through die-to-die interface circuits 203 and 205 in main IC die 101, and through the NOCs in regions 202, 204, and 221-222. The transceiver circuits 261-264 and the vertical die-to-die connections 256-257 provide direct, high-speed communications between the circuits in sectors 210 and the circuits in regions 270-285.

As another example, any one or more of the regions 270-285 may include input/output driver circuits that exchange signals between devices that are outside of IC dies 101-102 and circuits that are in any one or more of the other regions 270-285 in IC die 102 through the NOCs in regions 241-244 and 223-225. Any one or more of regions 270-285 may include input/output driver circuits that exchange signals between devices that are outside of IC dies 101-102 and programmable circuits that are in any one or more of sectors 210 in IC die 101 through the NOCs in regions 241-244 and 223-225 (including router circuits 233-234), vertical die-to-die connections 255 and 258, and the NOCs in regions 202, 204, and 221-222 (including router circuits 231-232). The signals may be, for example, data, clock, and control signals.

Figure 3:
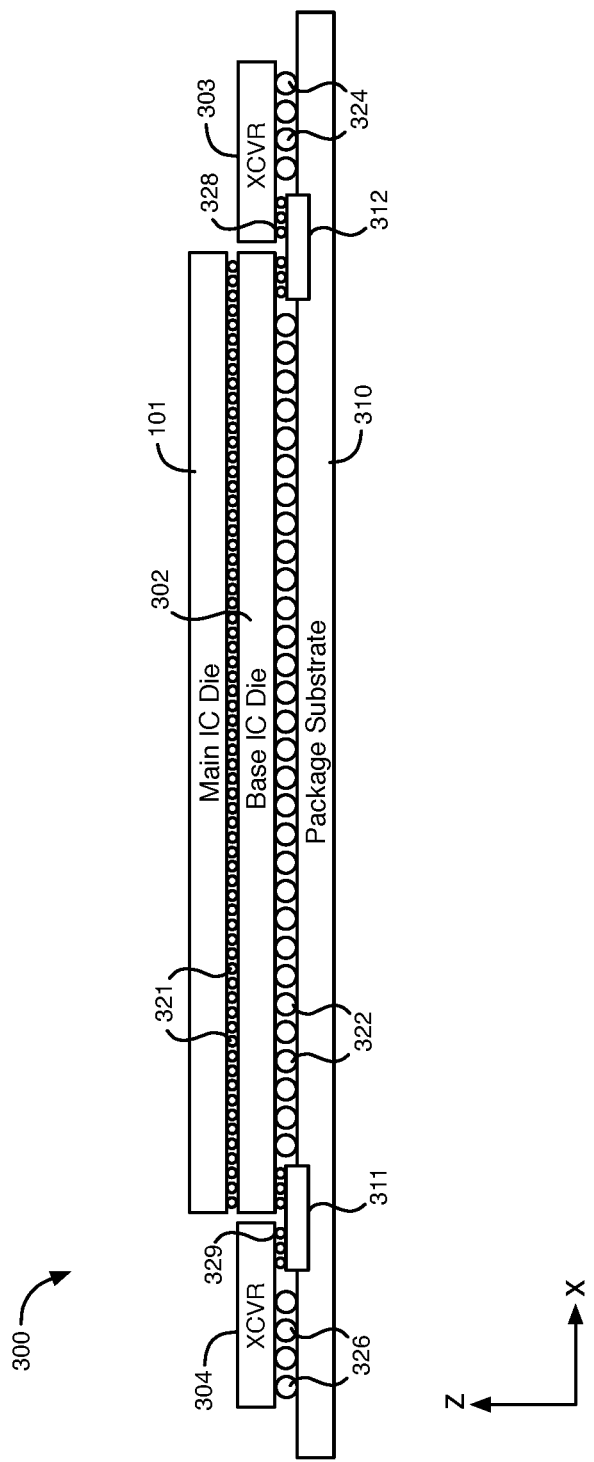
FIG. 3 illustrates a cross section of another exemplary integrated circuit (IC) package that includes a main IC die, a base IC die, two transceiver IC dies, connection bridges, and a package substrate, according to another embodiment.

FIG. 3 illustrates a cross section of another exemplary integrated circuit package 300 that includes main integrated circuit (IC) die 101, a base IC die 302, two transceiver IC dies 303-304, connection bridges 311-312, and a package substrate 310, according to another embodiment. The main IC die 101 and the base IC die 302 are vertically stacked and coupled together in the z direction shown in FIG. 3 to create a three dimensional (3D) programmable logic circuit system. The main IC die 101 is coupled to the base IC 302 through several conductive connections 321. The base IC die 302 has the same length as the main IC die 101 in the x direction, in the embodiment of FIG. 3. The base IC die 302 is coupled to the package substrate 310 through several conductive connections 322 (e.g., bumps). Transceiver IC die 303 is coupled to the package substrate 310 through conductive connections 324 (e.g., bumps). Transceiver IC die 303 is coupled to base IC die 302 through conductive connections 328 and conducive connections in connection bridge 312. Transceiver IC die 304 is coupled to the package substrate 310 through conductive connections 326. Transceiver IC die 304 is coupled to base IC die 302 through conductive connections 329 and conducive connections in connection bridge 311. Connection bridges 311-312 may include any type of conductive connections. In an alternative embodiment, transceiver IC dies 303-304 are coupled to base IC die 302 through connections in package substrate 310.

Figure 4:
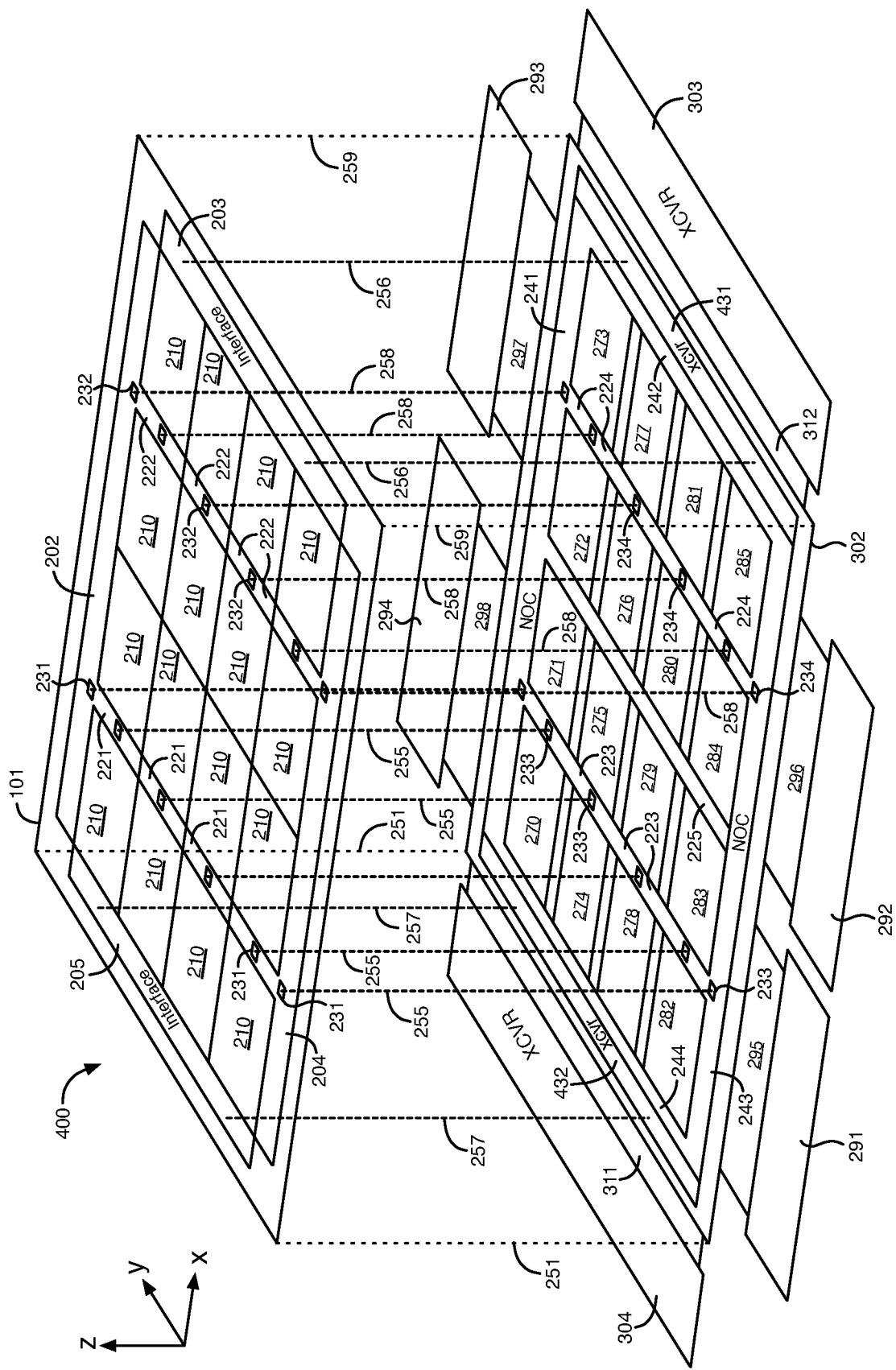
FIG. 4 illustrates additional details of the main IC die and the base IC die in the IC package of FIG. 3, according to an embodiment.

FIG. 4 illustrates additional details of the main IC die 101 and the base IC die 302 in IC package 300 of FIG. 3, according to an embodiment. IC package 300 also includes the memory integrated circuit (IC) dies 291-294 that are coupled to base IC die 302 through connections 295-298.

Structures in FIG. 4 that have the same reference numerals as the structures in FIGS. 1-2 have the same functions, and thus are not described in detail again with respect to FIG. 4. For example, the main IC die 101 of FIG. 4 has the same circuits, structures, and functions that are disclosed herein with respect to the main IC die 101 of FIGS. 1-2. Base IC die 302 includes regions 270-285, regions 223-225, and regions 241-244. Regions 270-285, regions 223-225, and regions 241-244 may have the same circuits, structures, and functions that are disclosed herein with respect to the regions of base IC die 102 having the same reference numerals in FIG. 2. Memory IC dies 291-294 and connections 295-298 may also have the same circuits, structures, and functions that are disclosed herein with respect to FIG. 2. For example, any one or more of the regions 270-285 in the base IC die 302 can include input/output (IO) circuits that connect directly to external devices through the package substrate 310 and connections 322, as discussed above with respect to FIG. 2.

The 3D programmable logic circuit system 400 of FIG. 4 also includes the transceiver integrated circuit (IC) dies 303-304 and the connection bridges 311-312 that are disclosed herein with respect to FIG. 3. Base IC die 302 includes transceiver (xcvr) interface region 431 next to region 242. Transceiver interface region 431 includes transceiver circuits that are coupled to the die-to-die interface circuits in region 203 through vertical die-to-die connections 256. The transceiver circuits in region 431 can transmit signals to and receive signals from the die-to-die interface circuits in region 203 through die-to-die connections 256.

Base IC die 302 also includes transceiver (xcvr) interface region 432 next to region 244. Transceiver interface region 432 includes transceiver circuits that are coupled to the die-to-die interface circuits in region 205 through vertical die-to-die connections 257. The transceiver circuits in region 432 may transmit signals to and receive signals from the die-to-die interface circuits in region 205 through die-to-die connections 257. In the programmable logic circuit system 400 of FIG. 4, signals (such as data, clock, and control signals) may be transmitted between the circuits in regions 270-285 of base IC die 302 and the programmable circuits in sectors 210 of main IC die 101 through the NOCs in regions 241-244 and 223-225 of IC die 302, through the transceiver circuits in one or both of regions 431-432 and the corresponding die-to-die connections 256-257, through die-to-die interface circuits 203 and 205 in main IC die 101, and through the NOCs in regions 202, 204, and 221-222 of main IC die 101.

Transceiver IC dies 303-304 include transceiver circuits that may be coupled to transmit signals to and receive signals from devices that are outside of IC package 300 through conductive connections 324 and 326, respectively, and through connections in package substrate 310. The transceiver circuits in transceiver IC die 303 are coupled through connection bridge 312 to transmit signals to, and to receive signals from, the transceiver circuits in region 431 of IC die 302. The transceiver circuits in transceiver IC die 303 can exchange signals (e.g., data, clock, and control signals) between devices that are outside of IC package 300 and circuits that are in any one or more of regions 270-285 in IC die 302 through the transceiver circuits in transceiver interface region 431 and through the NOCs in regions 241-244 and 223-225 of IC die 302. The transceiver circuits in transceiver IC die 303 can also exchange signals (e.g., data, clock, and control signals) between devices that are outside of IC package 300 and circuits that are in any one or more of sectors 210 of main IC die 101 through the transceiver circuits in transceiver interface region 431, die-to-die connections 256, the interface circuits in region 203, and the NOCs in regions 202, 204, and 221-222 of main IC die 101.

The transceiver circuits in transceiver IC die 304 are coupled through connection bridge 311 to transmit signals to, and to receive signals from, the transceiver circuits in region 432 of IC die 302. The transceiver circuits in transceiver IC die 304 can exchange signals (e.g., data, clock, and control signals) between devices that are outside of IC package 300 and circuits that are in any one or more of regions 270-285 in IC die 302 through the transceiver circuits in transceiver interface region 432 and through the NOCs in regions 241-244 and 223-225 of IC die 302. The transceiver circuits in transceiver IC die 304 can also exchange signals (e.g., data, clock, and control signals) between devices that are outside of IC package 300 and circuits that are in any one or more of sectors 210 of main IC die 101 through the transceiver circuits in transceiver interface region 432, die-to-die connections 257, the interface circuits in region 205, and the NOCs in regions 202, 204, and 221-222 of main IC die 101.

It should be recognized by one skilled in the art, that the present exemplary embodiments may be practiced without some or all of these specific details. In other instances, well-known operations have not been described in detail in order not to unnecessarily obscure the present embodiments.

The following examples pertain to further embodiments. Example 1 is a three dimensional circuit system comprising: a first integrated circuit die comprising programmable logic circuits that are arranged in sectors in the first integrated circuit die and first programmable interconnection circuits comprising first router circuits; and a second integrated circuit die comprising non-programmable circuits that are arranged in regions in the second integrated circuit die and second programmable interconnection circuits comprising second router circuits, wherein each of the regions is vertically aligned with at least one of the sectors, wherein each of the second router circuits is coupled to one of the first router circuits through a vertical die-to-die connection, wherein the first and second programmable interconnection circuits are programmable to route signals between the programmable logic circuits and the non-programmable circuits through the first and second router circuits, and wherein the first and second integrated circuit dies are coupled together in a vertically stacked configuration.

In Example 2, the three dimensional circuit system of Example 1 can optionally include, wherein the non-programmable circuits comprise a control circuit.

In Example 3, the three dimensional circuit system of Example 2 can optionally include, wherein the control circuit loads configuration data into memory circuits in one of the sectors for configuring the programmable logic circuits in the one of the sectors.

In Example 4, the three dimensional circuit system of any one of Examples 1-3 can optionally include, wherein the non-programmable circuits comprise a global control circuit and local control circuits, wherein the global control circuit provides configuration data to the local control circuits, and wherein each of the local control circuits loads a subset of the configuration data into one of the sectors through the first and second router circuits and the vertical die-to-die connections for configuring the programmable logic circuits in the one of the sectors.

In Example 5, the three dimensional circuit system of any one of Examples 1-4 can optionally include, wherein the non-programmable circuits comprise a clock signal generation circuit that generates a clock signal, and wherein the first and second programmable interconnection circuits are configurable to provide the clock signal to at least one of the programmable logic circuits through a vertically aligned die-to-die connection.

In Example 6, the three dimensional circuit system of any one of Examples 1-5 can optionally include, wherein the non-programmable circuits comprise a processor circuit that performs security functions for the programmable logic circuits.

In Example 7, the three dimensional circuit system of any one of Examples 1-6 can optionally include, wherein the non-programmable circuits comprise an input/output driver circuit that exchanges data with at least one of the programmable logic circuits and a device external to the three dimensional circuit system.

In Example 8, the three dimensional circuit system of any one of Examples 1-7 can optionally include, wherein the non-programmable circuits comprise a transceiver circuit that exchanges data between a device external to the three dimensional circuit system and at least one of the programmable logic circuits through an additional vertical die-to-die connection coupled to the transceiver circuit and to an interface circuit in the first integrated circuit die.

In Example 9, the three dimensional circuit system of any one of Examples 1-8 can optionally include, wherein the second integrated circuit die further comprises additional programmable logic circuits and memory circuits, and wherein the memory circuits store configuration data for configuring the additional programmable logic circuits and data accessible during execution of the additional programmable logic circuits.

In Example 10, the three dimensional circuit system of any one of Examples 1-9 can optionally include, wherein each of the regions is vertically aligned with at least two of the sectors.

Example 11 is an integrated circuit package comprising: a first integrated circuit die comprising programmable logic circuits and first programmable interconnection circuits configurable to transmit signals between the programmable logic circuits; and a second integrated circuit die coupled to the first integrated circuit die through die-to-die connections, wherein the second integrated circuit die comprises a processor circuit, a control circuit, an input/output driver circuit, a transceiver circuit, and a clock signal generation circuit that each generate an output signal that is provided to one of the programmable logic circuits through one of the die-to-die connections.

In Example 12, the integrated circuit package of Example 11 can optionally include, wherein the programmable logic circuits are arranged in sectors in the first integrated circuit die, wherein the second integrated circuit die comprises a global control circuit and local control circuits, wherein the global control circuit provides configuration data to the local control circuits, and wherein each of the local control circuits loads a subset of the configuration data into memory circuits in one of the sectors through the die-to-die connections to configure the programmable logic circuits in the one of the sectors.

In Example 13, the integrated circuit package of any one of Examples 11-12 can optionally include, wherein the processor circuit performs security functions for the programmable logic circuits.

In Example 14, the integrated circuit package of any one of Examples 11-13 can optionally further comprise: a third integrated circuit die coupled to the second integrated circuit die, wherein the input/output driver circuit exchanges data with the third integrated circuit die and at least one of the programmable logic circuits, and wherein the input/output driver circuit exchanges the data with the at least one of the programmable logic circuits through at least one of the die-to-die connections.

In Example 15, the integrated circuit package of any one of Examples 11-14 can optionally include, wherein the first integrated circuit die further comprises an interface circuit, and wherein the transceiver circuit exchanges data between a device external to the integrated circuit package and at least one of the programmable logic circuits through one of the die-to-die connections and the interface circuit.

In Example 16, the integrated circuit package of any one of Examples 11-15 can optionally include, wherein the second integrated circuit die further comprises second programmable interconnection circuits, and wherein the first and second programmable interconnection circuits are programmable to route signals between the programmable logic circuits and the processor circuit, the control circuit, the input/output driver circuit, and the clock signal generation circuit through the die-to-die connections.

Example 17 is a method for operating an integrated circuit package comprising first and second integrated circuit dies that are coupled together in a vertically stacked configuration through die-to-die connections, the method comprising: configuring programmable logic circuits in the first integrated circuit die with configuration data that is loaded into the programmable logic circuits from a control circuit in the second integrated circuit die through at least one of the die-to-die connections; performing security functions for the programmable logic circuits using a processor circuit in the second integrated circuit die; exchanging data with a third integrated circuit die and at least one of the programmable logic circuits through at least one of the die-to-die connections using an input/output driver circuit in the second integrated circuit die; and providing a clock signal generated by a clock signal generation circuit in the second integrated circuit die to at least one of the programmable logic circuits through one of the die-to-die connections.

In Example 18, the method of Example 17 can optionally further comprise: configuring first programmable interconnection circuits in the first integrated circuit die and second programmable interconnection circuits in the second integrated circuit die to provide signals between the programmable logic circuits and the control circuit, the processor circuit, the input/output driver circuit, and the clock signal generation circuit.

In Example 19, the method of any one of Examples 17-18 can optionally further comprise: exchanging data between a device external to the integrated circuit package and at least one of the programmable logic circuits through at least one of the die-to-die connections using a transceiver circuit in the second integrated circuit die.

In Example 20, the method of any one of Examples 17-19 can optionally include, wherein configuring the programmable logic circuits in the first integrated circuit die with the configuration data further comprises: providing the configuration data from the control circuit to additional control circuits; and using each of the additional control circuits, loading a subset of the configuration data into a sector of the programmable logic circuits to configure the programmable logic circuits in the sector.

In Example 21, the method of any one of Examples 17-20 can optionally further include: transmitting signals between the programmable logic circuits through a first programmable network-on-chip on the first integrated circuit die; and transmitting signals from the control circuit and the processor circuit through a second programmable network-on-chip on the second integrated circuit die and through the first programmable network-on-chip to the programmable logic circuits.

The foregoing description of the exemplary embodiments has been presented for the purpose of illustration. The foregoing description is not intended to be exhaustive or to be limiting to the examples disclosed herein. In some instances, various features can be employed without a corresponding use of other features as set forth. Many modifications, substitutions, and variations are possible in light of the above teachings, without departing from the scope of the present embodiments.

What is claimed is:

1. A three dimensional circuit system comprising:
a first integrated circuit die comprising first programmable logic circuits that are arranged in sectors in the first integrated circuit die and first programmable interconnection circuits comprising first router circuits; and
a second integrated circuit die comprising non-programmable circuits that are arranged in regions in the second integrated circuit die and second programmable interconnection circuits comprising second router circuits, wherein the first and second programmable interconnection circuits are programmable to route signals between the first programmable logic circuits and the non-programmable circuits through the first and second router circuits, wherein the first and second integrated circuit dies are coupled together in a vertically stacked configuration,
wherein the second integrated circuit die further comprises second programmable logic circuits and memory circuits, and wherein the memory circuits store configuration data for configuring the second programmable logic circuits and data accessible during execution of the second programmable logic circuits.

2. The three dimensional circuit system of claim 1, wherein the non-programmable circuits comprise a control circuit.

3. The three dimensional circuit system of claim 2, wherein the control circuit loads additional configuration data into additional memory circuits in one of the sectors for configuring the first programmable logic circuits in the one of the sectors.

4. The three dimensional circuit system of claim 1, wherein the non-programmable circuits comprise a global control circuit and local control circuits, wherein the global control circuit provides additional configuration data to the local control circuits, and wherein each of the local control circuits loads a subset of the additional configuration data into one of the sectors through the first and second router circuits and vertical die-to-die connections for configuring the first programmable logic circuits in the one of the sectors.

5. The three dimensional circuit system of claim 1, wherein the non-programmable circuits comprise a clock signal generation circuit that generates a clock signal, and wherein the first and second programmable interconnection circuits are configurable to provide the clock signal to at least one of the first programmable logic circuits through a vertically aligned die-to-die connection.

6. The three dimensional circuit system of claim 1, wherein the non-programmable circuits comprise a processor circuit that performs security functions for the first programmable logic circuits.

7. The three dimensional circuit system of claim 1, wherein the non-programmable circuits comprise an input/output driver circuit that exchanges data with at least one of the first programmable logic circuits and a device external to the three dimensional circuit system.

8. The three dimensional circuit system of claim 1, wherein the non-programmable circuits comprise a transceiver circuit that exchanges data between a device external to the three dimensional circuit system and at least one of the first programmable logic circuits through a vertical die-to-die connection coupled to the transceiver circuit and to an interface circuit in the first integrated circuit die.

9. The three dimensional circuit system of claim 1, wherein each of the regions is vertically aligned with at least one of the sectors, and wherein each of the second router circuits is coupled to one of the first router circuits through a vertical die-to-die connection.

10. The three dimensional circuit system of claim 1, wherein each of the regions is vertically aligned with at least two of the sectors.

11. An integrated circuit package comprising:
a first integrated circuit die comprising programmable logic circuits and first programmable interconnection circuits configurable to transmit signals between the programmable logic circuits; and
a second integrated circuit die coupled to the first integrated circuit die through die-to-die connections, wherein the second integrated circuit die comprises a processor circuit, an input/output driver circuit, a transceiver circuit, and a clock signal generation circuit that each generate an output signal that is provided to one of the programmable logic circuits through one of the die-to-die connections, wherein the programmable logic circuits are arranged in sectors in the first integrated circuit die, wherein the second integrated circuit die further comprises a global control circuit and local control circuits, wherein the global control circuit provides configuration data to the local control circuits, and wherein each of the local control circuits loads a subset of the configuration data into memory circuits in one of the sectors through the die-to-die connections to configure the programmable logic circuits in the one of the sectors.

12. The integrated circuit package of claim 11, wherein the clock signal generation circuit comprises at least one of a phase-locked loop circuit, a delay-locked loop circuit, or an oscillator circuit.

13. The integrated circuit package of claim 11, wherein the processor circuit performs security functions for the programmable logic circuits.

14. The integrated circuit package of claim 11 further comprising:

a third integrated circuit die coupled to the second integrated circuit die, wherein the input/output driver circuit exchanges data with the third integrated circuit die and at least one of the programmable logic circuits, and wherein the input/output driver circuit exchanges the data with the at least one of the programmable logic circuits through at least one of the die-to-die connections.

15. The integrated circuit package of claim 11, wherein the first integrated circuit die further comprises an interface circuit, and wherein the transceiver circuit exchanges data between a device external to the integrated circuit package and at least one of the programmable logic circuits through one of the die-to-die connections and the interface circuit.

16. The integrated circuit package of claim 11, wherein the second integrated circuit die further comprises second programmable interconnection circuits, and wherein the first and second programmable interconnection circuits are programmable to route signals between the programmable logic circuits and the processor circuit, the input/output driver circuit, and the clock signal generation circuit through the die-to-die connections.

17. A method for operating an integrated circuit package comprising first and second integrated circuit dies that are coupled together in a vertically stacked configuration through die-to-die connections, the method comprising:

configuring programmable logic circuits in the first integrated circuit die with configuration data that is loaded into the programmable logic circuits from a control circuit in the second integrated circuit die through at least one of the die-to-die connections;

performing security functions for the programmable logic circuits using a processor circuit in the second integrated circuit die;

exchanging data with a third integrated circuit die and at least one of the programmable logic circuits through at least one of the die-to-die connections using an input/output driver circuit in the second integrated circuit die; and providing a clock signal generated by a clock signal generation circuit in the second integrated circuit die to at least one of the programmable logic circuits through one of the die-to-die connections.

18. The method of claim 17 further comprising:

configuring first programmable interconnection circuits in the first integrated circuit die and second programmable interconnection circuits in the second integrated circuit die to provide signals between the programmable logic circuits and the control circuit, the processor circuit, the input/output driver circuit, and the clock signal generation circuit.

19. The method of claim 17 further comprising:

exchanging data between a device external to the integrated circuit package and at least one of the programmable logic circuits through at least one of the die-to-die connections using a transceiver circuit in the second integrated circuit die.

20. The method of claim 17, wherein configuring the programmable logic circuits in the first integrated circuit die with the configuration data further comprises:

providing the configuration data from the control circuit to additional control circuits; and using each of the additional control circuits, loading a subset of the configuration data into a sector of the programmable logic circuits to configure the programmable logic circuits in the sector.

21. The method of claim 17 further comprising:

transmitting signals between the programmable logic circuits through a first programmable network-on-chip on the first integrated circuit die; and transmitting signals from the control circuit and the processor circuit through a second programmable network-on-chip on the second integrated circuit die and through the first programmable network-on-chip to the programmable logic circuits.

\* \* \* \* \*